(12) United States Patent
Pasadyn et al.

(10) Patent No.: US 6,588,007 B1
(45) Date of Patent: Jul. 1, 2003

(54) USE OF ENDPOINT SYSTEM TO MATCH INDIVIDUAL PROCESSING STATIONS WITHIN A TOOL

(75) Inventors: Alexander J. Pasadyn, Austin, TX (US); Joyce S. Oey Hewett, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 248 days.

(21) Appl. No.: 09/753,705

(22) Filed: Jan. 3, 2001

(51) Int. Cl.[7] .............................................. G06F 17/50
(52) U.S. Cl. ............................ 716/19; 716/20; 716/21
(58) Field of Search ............................ 716/19; 451/6, 451/10, 288; 216/38; 700/95; 438/16

(56) References Cited

U.S. PATENT DOCUMENTS 5,499,733 A * 3/1996 Litvak ........................ 216/38
5,586,039 A * 12/1996 Hirsch et al. .................. 700/95
6,179,688 B1 * 1/2001 Beckage et al. ................ 451/6

* cited by examiner

Primary Examiner—Vuthe Siek
Assistant Examiner—Naum Levin
(74) Attorney, Agent, or Firm—Williams, Morgan & Amerson, P.C.

(57) ABSTRACT

A technique for processing a wafer in a semiconductor manufacturing process are disclosed. The method comprises first collecting a set of processing rate data from a multi-station processing tool, the set including process rate data from at least two stations in the processing tool. The collected processing rate data is then communicated to a controller that autonomously compares the processing rate data to determine whether to adjust a process parameter. The method then adjusts the process parameter for at least one station to match the process endpoint for the at least one station.

38 Claims, 4 Drawing Sheets

USE OF ENDPOINT SYSTEM TO MATCH INDIVIDUAL PROCESSING STATIONS WITHIN A TOOL

BACKGROUND OF THE INVENTION

1. Field of the Invention

This invention generally pertains to semiconductor processing, and, more particularly, to the polishing of process layers formed above a semiconducting substrate.

2. Description of the Related Art

The manufacture of semiconductor devices generally involves the formation of various process layers, selective removal or patterning of portions of those layers, and deposition of additional process layers above the surface of a semiconducting substrate. The substrate and the deposited layers are collectively called a "wafer." This process continues until a semiconductor device is completely constructed. The process layers may include, by way of example, insulation layers, gate oxide layers, conductive layers, and layers of metal or glass, etc. It is generally desirable in certain steps of the wafer fabrication process that the uppermost surface of the process layers be approximately planar, i.e., flat, for the deposition of subsequent layers. The operation used to produce an approximately flat, uppermost surface on a wafer is called "planarization."

One planarization operation is known as "chemical-mechanical polishing," or "CMP." In a CMP operation, a deposited material is polished to planarize the wafer for subsequent processing steps. Both insulative and conductive layers may be polished, depending on the particular step in the manufacturing process. For instance, a layer of metal previously deposited on the wafer may be polished with a CMP tool to remove a portion of the metal layer to form conductive interconnections such as metal lines and plugs. The CMP tool removes the metal process layer using an abrasive action created by a chemically active slurry and a polishing pad. A typical objective is to remove the metal process layer down to the upper level of the insulative layer, but this is not always the case.

The point at which the excess conductive material is removed and the embedded interconnects remain is called the "endpoint" of the CMP operation. CMP tools use optical reflection, thermal detection, and/or friction-based techniques to detect the endpoint. The CMP operation should result in a planar surface with little or no detectable scratches or excess material present on the surface. In practice, the wafer, including the deposited, planarized process layers, are polished beyond the endpoint (i.e., "overpolished") to ensure that all excess conductive material has been removed. Excessive overpolishing increases the chances of damaging the wafer surface, uses more of the consumable slurry and pad than may be necessary, and reduces the production rate of the CMP equipment. The window for the polish time endpoint can be small, e.g., on the order of seconds. Also, variations in material thickness may cause the endpoint to change. Thus, accurate in-situ endpoint detection is highly desirable.

Furthermore, a CMP tool typically polishes several, sometimes as many as five, wafers at the same time. Variations and tolerances in the manufacturing process create variations in the wafers. Frequently, one or more wafers will be polished to the endpoint while the others are not. Conventional CMP tools, however, must polish all the wafers for the same length of time. This is true, even though optical reflection, thermal detection, and friction based data may indicate one or more of the wafers are at the endpoint. Consequently, when the CMP tool halts the operation, the wafers will be at varying stages ranging from very overpolished to underpolished. If a particular CMP tool continually underpolishes or excessively overpolishes at one of its stations, it can be manually adjusted. More particularly, the CMP tool can be taken out of a process flow, tested, manually adjusted, and re-introduced into the process flow.

This particular problem is not limited to CMP tools. Many kinds of processing tools include multiple workstations performing identical operations at different rates. Among these types of tools are, for instance, multi-chamber etchers. Etching is an extremely common operation used to selectively remove portions of layers on a wafer. An etcher typically includes several etching chambers. As with the multi-station CMP tool, wafer-to-wafer variations may be encountered because of the etcher's operation. These variations in etching rates injects still further variation into the manufacturing process, thereby decreasing yields.

The present invention is directed to a semiconductor processing method and apparatus that solves, or at least reduces, some or all of the aforementioned problems.

SUMMARY OF THE INVENTION

The invention includes a technique for processing a wafer in a semiconductor manufacturing process are disclosed. In one aspect, a method comprises first collecting a set of processing rate data from a multi-station processing tool, the set including process rate data from at least two stations in the processing tool. The collected processing rate data is then communicated to a controller that autonomously compares the processing rate data to determine whether to adjust a process parameter. The method then adjusts the process parameter for at least one station to match the process endpoint for the at least one station. In other aspects, the invention includes a program storage medium encoded with instructions to perform the method and a computing device programmed to perform the method.

BRIEF DESCRIPTION OF THE DRAWINGS

The invention may be understood by reference to the following description taken in conjunction with the accompanying drawings, in which like reference numerals identify like elements, and in which.

Figure 1:
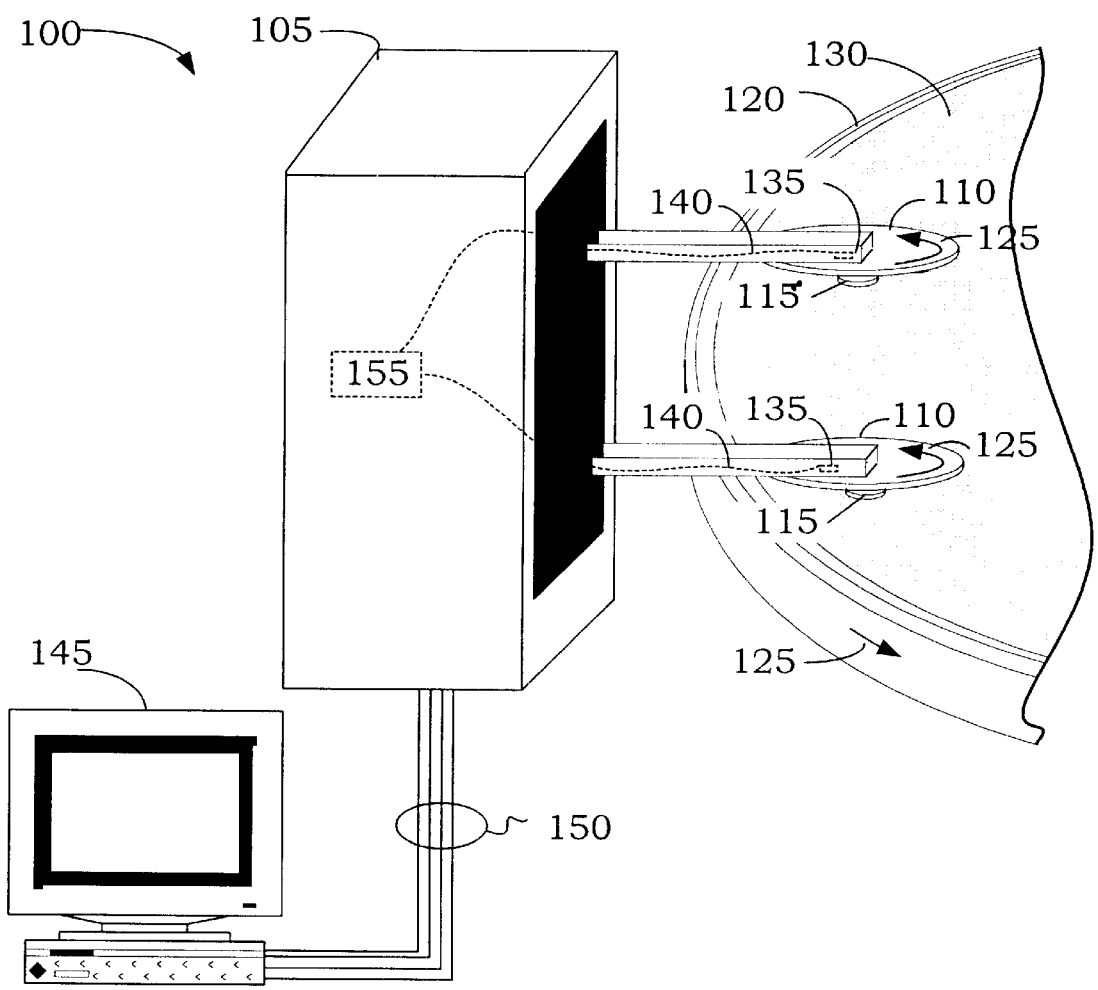
FIG. 1 illustrates, in a conceptualized diagram, one particular embodiment of a multi-station process tool operated in accordance with the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will be appreciated that in the development of any such actual embodiment, numerous implementation-specific decisions must be made to achieve the developers' specific goals, such as compliance with system-related and business-related constraints, that will vary from one implementation to another. Moreover, it will be appreciated that such a development effort, even if complex and time-consuming, would be a routine undertaking for those of ordinary skill in the art having the benefit of this disclosure.

FIG. 1 depicts a conceptualization of an apparatus 100 operated in accordance with the present invention. The apparatus 100 includes a multi-station processing tool 105. In this particular embodiment, the processing tool is a CMP tool. The CMP tool 105 in the particular embodiment employs five carriers 110, only two of which are shown for the sake of clarity, and each carrier 110 is capable of polishing one a wafer 115 on the polishing table 120. Each carrier 110 is a separate processing station. Thus, the CMP tool 105 is but one particular embodiment of a multi-station processing tool and has five processing stations. Note that alternative embodiments might employ alternative types of process tools. Exemplary alternative processing tools that may be used include, but are not limited to, multi-chamber etchers. In a multi-chamber etcher, each chamber is considered a processing station.

Returning to FIG. 1, each of the carriers 110 and the polishing table 120 rotate counterclockwise as illustrated by the arrows 125. Each of the carriers 110 is driven by a carrier motor (not shown) and a table motor (not shown) drives the polishing table 120. A polishing pad stack 130 is, in this particular embodiment, a Rodel IC1000/Suba dual pad stack secured to the polishing table 120 in a manner known to the art. Thus, as the polishing table 120 rotates, so does the polishing pad stack 130.

As will be appreciated by those in the art having the benefit of this disclosure, the CMP tool 105 will also include a variety of process sensors monitoring the process. Processing tools are frequently equipped with a variety of sensors used to detect various parameters of the operation. Processing tools usually are not equipped with such process sensors when purchased. Instead, the processing tool and the sensors are usually purchased separately and the processing tool is retrofitted with the process sensor. The sensors are therefore usually referred to as "add-on" sensors. In this particular embodiment, the process sensors may include thermal cameras and optical sensors (not shown) for monitoring the CMP operation. In the illustrated embodiment, each carrier 110 includes a process sensor 135 that senses the downforce F exerted by the respective carrier 110. Each sensor 135 generates a signal representative of the magnitude of the respective exerted downforce F. Each generated signal is transmitted via a lead 140.

Note that the type of process sensors employed by any particular embodiment will depend, to some degree, on the type of process. For instance, downforce is not a relevant characteristic of an etching process in a multi-chamber etcher. Even within a given process type, there will be some variation. For instance, downforce sensors, thermal cameras, and optical sensors were specifically mentioned. But CMP tools also typically sense other operational characteristics such as table motor current, carrier motor current, and still others. Thus, the type of process sensor employed by a given embodiment will be implementation specific.

The apparatus 100 also comprises a programmable computing device 145 exchanging signals with a CMP tool 105 over a bus system 150. The programmable computing device 145 may be any computer suitable to the task and may include, without limitation, a personal computer (desktop or laptop), a workstation, a network server, or a mainframe computer. The computing device 145 may operate under any suitable operating system, such as Windows®, MS-DOS, OS/2, UNIX, or Mac OS. The bus system 150 may operate pursuant to any suitable or convenient bus or network protocol. Exemplary network protocols include Ethernet, RAMBUS, Firewire, token ring, and straight bus protocols. Some embodiments may also employ one or more serial interfaces, e.g., RS232, SECS, GEM.

As will be recognized by those in the art having the benefit of this disclosure, the appropriate types of computer, bus system, and process tool will depend on the particular implementation and concomitant design constraints, such as cost and availability. In one particular variation of this embodiment, the computing device 145 is an IBM compatible, desktop personal computer operating on a Windows® and/or Windows® NT operating system; the CMP tool 105 is manufactured by Speedfam Corporation; and the bus system 150 is an Ethernet network. Note that the CMP tool may be any CMP tool known to the art. The design, installation, and operation of Ethernet networks are well known in the art. A data collection and processing unit 155 collects and transmits the data signals output by the process sensors 135 to the computing device 145 in accordance with the Ethernet protocol the data collection and processing unit 155 may be embedded in the CMP tool 105 or may be an "add-on" unit with which the CMP tool 105 is retrofitted for this purpose. The particular CMP tool 105 employed in this embodiment is equipped with a network port through which the computing device 145 interfaces with the unit 155 over the bus system 150. These selections resulted in an apparatus 100 that implements the present invention in both hardware and software. However, other embodiments may employ hardware or software only, as will be appreciated by those skilled in the art.

The CMP tool 105 also includes the data collection and processing unit 155 previously mentioned. The data collection and processing unit 155 receives data signals, including a signal representative of the downforce magnitude, via the lead 140. In other implementations, the signal may be representative of other process parameters such as carrier motor current and/or table motor current. The precise identity of the process parameter is immaterial to the practice of the invention so long as the process parameter is used in defining the endpoint operation. An etch process, for instance, will use an entirely different set of process parameters, as will be appreciated by those skilled in the art having the benefit of this disclosure. The data collection and processing unit 155 receives each of the data signals via a respective lead 140, simultaneously and in parallel in this particular embodiment. The unit 155 then transmits the data signals to the computing device 145 over the bus system 150. In this particular embodiment, these data signals are unfiltered when transmitted. Alternative embodiments might, however, filter the signals after collection and before transmitting them to the computing device 145.

The computing device 145 is programmed to execute an applications software package whose instructions are encoded on the computing device 145's hard disk (not shown). More particularly, the computing device 145 is programmed to implement the method 400 of FIG. 4 discussed further below. Although not previously applied in the present context, commercial, off-the-shelf software packages are available that may be configured to perform this method. One such package is the LabVIEW™ (Version 5.0) software applications available from National Instruments Corporation, located at 5700 N Mopac Expressway, Austin, Tex. 78759-3504, and who may be contacted by telephone at (512) 794-0100.

Figure 2A:
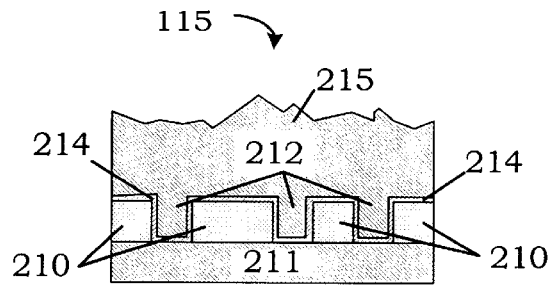
FIGS. 2A and 2B illustrate the planarization of a wafer during a CMP operation.
Figure 2B:
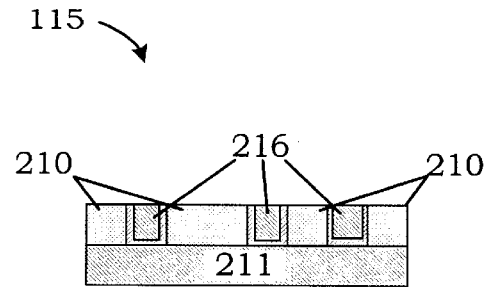

FIGS. 2A and 2B illustrate the planarization of a wafer 115 in accordance with the illustrated embodiment of the present invention. FIG. 2A illustrates, in cross-section, a portion of the wafer 115 during the manufacture of a semiconducting device. The wafer 115 is fabricated by first depositing a layer of insulative material 210 over the substrate 211 and partially etching the insulative layer away to create the opening 212 in the layer 210. A first layer of conductive material 214 and a second layer of conductive material 215 are then sequentially deposited over the wafer 115 to cover the layer 210 and the substrate 211. The first and second layers 214, 215 are metals. Typically, the second layer 215 possesses properties desirable for some particular purpose but does not suitably adhere to the substrate 211. The first layer 214, however, adheres to both the second layer 215 and the substrate 211 and provides a suitable mechanism for adhering the second layer 215 to the wafer 115 as a whole. For this reason, the first layer 214 is sometimes referred to as a "glue layer" or an "adhesion layer." The first layer 214 is also sometimes called a "barrier metal." The first and second layers of conductive material 214, 215 are then "planarized" in a chemical, mechanical polishing ("CMP") operation to create the interconnects 216 in the opening 212 in the insulating layer 210, shown in FIG. 2B.

Figure 3A:
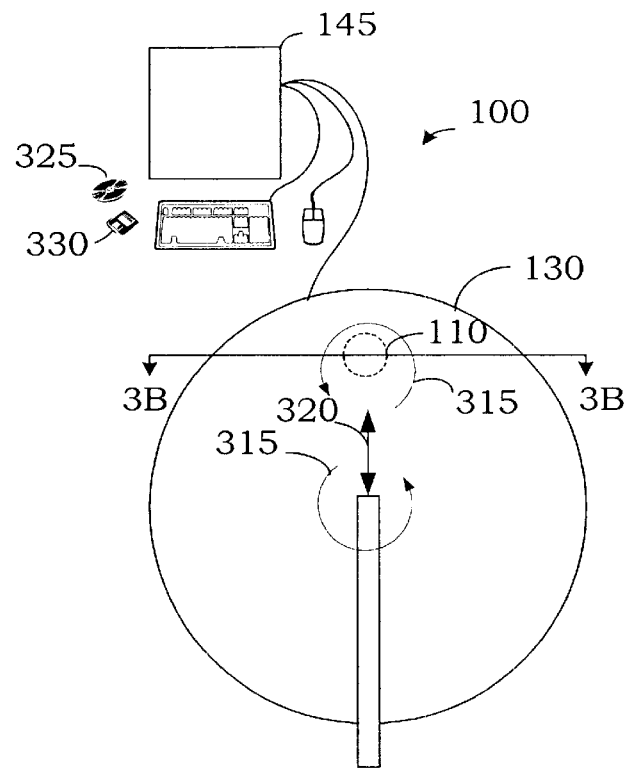
FIGS. 3A and 3B depict a CMP tool in a top plan view and in a view taken along line 3B—3B in FIG. 3A, respectively, and illustrate its operation during a CMP operation in accordance with one particular embodiment of the present invention.
Figure 3B:
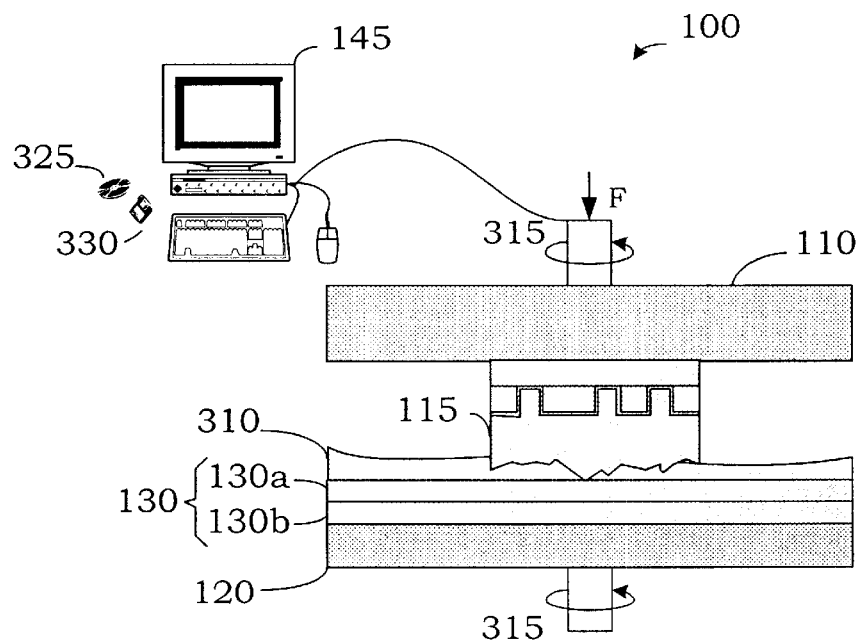

FIGS. 3A–3B conceptually illustrate a portion of the CMP equipment 200 by which the CMP operation may be performed in accordance with the illustrated embodiment of the present invention. After the first and second layers 214, 215 are deposited, the wafer 115 is mounted upside down on a carrier 110. The carrier 110 pushes the wafer 115 downward with a "downforce" F. The carrier 110 and the wafer 115 are rotated above a rotating pad stack 130 on the polishing table 120 as the carrier 110 pushes the wafer 115 against the rotating pad stack 130. The pad stack 130 typically comprises a hard polyurethane pad 130a on a poromeric pad 130b. The poromeric pad 130b is a softer felt type pad and the hard polyurethane pad 130a is a harder pad used with the slurry 310. In one particular embodiment, the rotating pad stack 130 is a Rodel IC1000/Suba IV pad stack commercially available from Rodel, Inc., which may be contacted at 451 Bellevue Road, Newark, Del. 19713. The Rodel IC 1000/Suba IV pad stack includes a poromeric pad sold under that mark Rodel Suba IV and a hard polyurethane pad sold under the mark Rodel IC1000 pad. Note that the Suba IV can be considered a poromeric, but that it does not contact the wafer 115 during polish as the IC1000 fully covers the Suba IV pad. However, any pad stack known to the art may be used.

The slurry 310 is introduced between the rotating wafer 115 and the rotating pad stack 130 during the polishing operation. The slurry 310 contains a chemical that dissolves the uppermost process layer(s) and an abrasive material that physically removes portions of the layer(s). The composition of the slurry 310 will depend somewhat upon the materials from which the first and second layers 214, 215 are constructed. In one particular embodiment, the wafer 115 is a Tungsten/Fitanium Nitride/Titanium stack and the slurry 310 is a Semi-Sperse W-2585 slurry commercially available from the Microelectronic Materials Division of Cabot Corp., which may be contacted at 500 Commons Drive, Aurora, Ill. 60504. This particular slurry employs a silica abrasive and a peroxide oxidizer. Other wafer compositions, however, might employ alternative slurries.

The carrier 110, the wafer 115, and the pad stack 130 are rotated to polish the first and second layers 214, 215 to produce the interconnects 216 shown in FIG. 2B. The wafer 115 and the pad stack 130 may be rotated in the same direction or in opposite directions, whichever is desirable for the particular process being implemented. In the example of FIGS. 3A and 3B, the wafer 115 and the pad stack 130 are rotated in the same direction as indicated by the arrows 315. The carrier 110 may also oscillate across the pad stack 130 on the polishing table 120, as indicated by the arrow 320. As the various pieces are rotated, the second layer 215 is abraded away. The first layer 214 is typically thin relative to the second layer 215 and is abraded away quite quickly. The endpoint of the polishing operation is therefore reached quickly after the second layer 215 is gone. This might be as little as a couple of seconds. For this reason, the first layer 214 should be no less than approximately 50 Å–100 Å to prevent achieving the endpoint to quickly for it to be detected.

Thus, the conduct of the operation is controlled by a variety of process parameters, including, but not limited to:

the table motor current, which determines the rotational rate of the polishing table 120;

the carrier motor current, which determines the rotational rate of the carriers; and the downforce exerted by the carriers 110.

These process parameters are set by the "recipe" and, in conventional systems, each processing station is fed the same recipe. The present invention, however, permits autonomous adjustment of individualized recipes for each processing station. "Autonomous" means, in this context, without human intervention.

As mentioned, the apparatus 100 includes a programmed computing device 145. The carrier 110, rotating pad stack 130, and polishing table 120 all comprise a portion of the CMP tool 105 whose operation is controlled by the programmed computing device 145. The programmed computing device 145 illustrated is a stand-alone workstation, but the invention is not limited by the nature of the programmed computing device 145. For instance, the programmed computing device 145 might, in alternative embodiments, be a processor embedded in the CMP tool 105. Suitable processors might include microprocessors, digital signal processors, or micro-controllers. The programmed computing device might also be, e.g., a desktop personal computer. Thus, the programmed computing device 145 might vary widely depending on the particular implementation.

Figure 4:
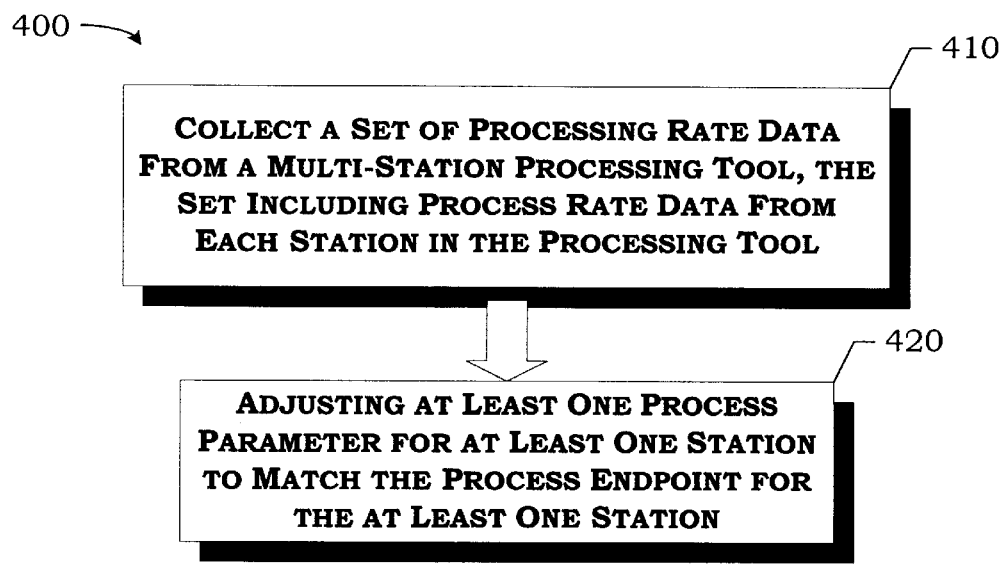
FIG. 4 illustrates a method practiced in accordance with the present invention.

The programmed computing device 145 implements the method 400 of FIG. 4 using the CMP tool 105 in accordance with one particular embodiment of the present invention. The program is stored on some type of computer-readable, program storage medium. The program storage medium may be optical, such as the optical disk 325, or magnetic, such as the floppy disk 330. However, the invention is not limited by the particular nature of the program storage medium and alternative embodiments may employ alternative implementations. For instance, the program may be stored on a magnetic tape or the hard drive of a personal computer. Still other variations might be found in alternative embodiments.

Accordingly, some portions of the detailed description herein are presented in terms of software implemented techniques, algorithms and/or symbolic representations of operations on data bits within a computer memory. These terms are the means used by those skilled in the art to most effectively convey the substance of their work to others skilled in the art. Such a software implemented technique or algorithm is herein, and is generally, conceived to be a self-consistent sequence of steps leading to a desired result. The steps are those requiring physical manipulations of physical quantities. Usually, though not necessarily, these quantities take the form of electrical, magnetic, or optical signals capable of being stored, transferred, combined, compared, and otherwise manipulated. It has proven convenient at times, principally for reasons of common usage, to refer to these signals as data, bits, values, elements, symbols, characters, terms, numbers, or the like.

However, all of these and similar terms are to be associated with the appropriate physical quantities. The terms are merely convenient labels applied to these quantities. Unless specifically stated otherwise, or is apparent from the discussion, terms such as "processing" or "computing" or "calculating" or "determining" or "displaying" or the like, refer to the action and processes of a computer system, or similar computing device, that manipulates and transforms data represented as physical quantities within a computer's memory into other data similarly represented as physical quantities within the computer's memory or other such information storage, transmission or display devices.

Thus, the method 400 in FIG. 4 is but one aspect of the present invention. The present invention also includes the computing device 145 programmed to perform the method 400, the program storage medium, such as the disks 325, 330, on which the program is encoded, or even the entire process tool 105. Still other variations and permutations of these aspects are included with the scope and spirit of the invention as claimed below.

Returning to FIG. 4, the method 400 is a method for processing a wafer in a semiconductor manufacturing process. The method is performed "autonomously," i e., without direct human intervention. The method 400 begins by collecting a set of processing rate data from a multi-station processing tool, e.g., the CMP tool 105, as set forth in the box 410. The set includes process rate data from each station in the processing tool, e.g., each carrier 110 of the CMP tool 105. The process rate data may be implementation specific, but will typically be the elapsed time from the start of the operation to the endpoint. What constitutes the "endpoint" will vary according to the process. The endpoint is usually predetermined on a number of criteria that, when they exceed a given threshold, indicate that the process has completed. Endpoint definition in the context of the various types of operations is well known to the art.

The method 400 continues by adjusting at least one process parameter, e.g., downforce, for at least one station, e.g., a carrier 110, to match the process endpoint for the at least one station, as set forth in the box 420. "Matching" the process endpoint, in this context, means that the station reaches the endpoint at the same time as the other stations. Ideally, all stations would reach the endpoint at the same, i.e., all the stations would be matched. However, this is not necessary to the practice of the invention. Some implementations may achieve substantial performance increases by only matching a subset of the stations. Note that the term "match" does not necessarily imply that the various stations reach the endpoint at the exact same time with some extreme degree of precision. Instead, "match" implies at the same approximate time permitted by the tolerances inherent in a manufacturing process.

In one particular embodiment, the process rate data is collected in a first run, but the adjustment for the process parameter is implemented in a second run. Thus, this particular embodiment uses the present invention to control the operation on a "run-to-run" basis. However, the invention is not so limited, and the adjustments may be made in "real time" in the same run. Furthermore, this particular run-to-run control technique to reduce wafer-to-wafer variations arising from the process.

Figure 5:
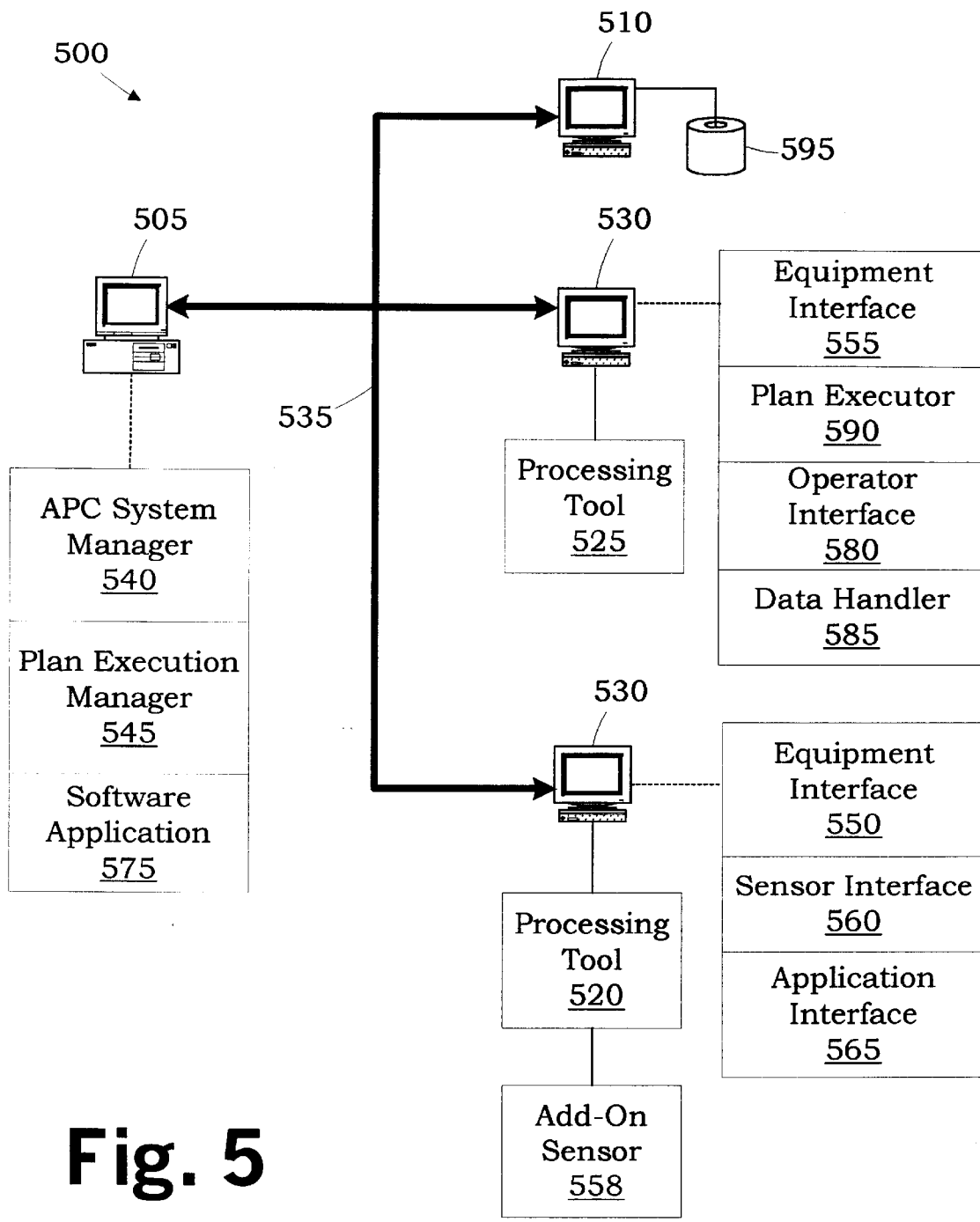
FIG. 5 illustrates one particular embodiment of a process flow implemented in accordance with the present invention.

To further an understanding of the invention, a more particular implementation of the embodiment disclosed above is illustrated in FIG. 5. FIG. 5 is a simplified block diagram of an advanced process control ("APC") system 500 is shown. The APC System 500 comprises a distributed software system of interchangeable, standardized software components permitting run-to-run control and fault detection/classification. The software components implement an architectural standard based on the Semiconductor Equipment and Materials International ("SEMI") Computer Integrated Manufacturing ("CIM") Framework compliant system technologies and the APC Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. This particular architecture relies heavily on software utilizing object oriented programming and employs the Object Management Group's ("OMG") Common Object Request Broker Architecture ("CORBA") and CORBA_Services specifications for distributed object systems. Information and specifications for the OMG CORBA architecture are also readily, publicly available. An exemplary software system capable of being adapted to perform the functions of the APC system 500 as described herein is the Catalyst system offered by KLA-Tencor, Inc.

The software components communicate with each other using the CORBA Interface Definition Language ("IDL") and rely on a common set of services to support their interaction. A standard set of distributed-object services are defined by the OMG. Among these services are:

CORBA—the standard-based communications protocol used for all direct component-to-component interaction. Standard interfaces can be defined according to an object-oriented, remote invocation communications model. These interfaces and all APC communications are defined using IDL. Components communicate by invoking operations on each others interfaces. Data is passed between components as operation parameters and return values.

OMG Event Service—supports asynchronous communications between components. Many of the APC objects emit events as they change state. These events are received by interested event subscribers. Examples of event usage within the APC system include, but are not limited to, communication component state (including error state), notification of fault alarms detected by fault detection and classification software, and reporting of machine status and collected data.

OMG Trading Service—enables a component to find another component with which to interact. When a component is installed, a description of its services (a services offer) is exported to the Trading Service. Another component can later request a list of service providers that meet certain criteria. The Trading Service supplies a list of other components that can provide the requested service. That capability is used upon component startup to allow one component to find other components with which it must interact. It is also used upon Plan Startup when a Plan Execution component needs to find Capability Providers to provide the required capabilities specified in the plan.

These services are well known in the art. OMG's CORBA/IIOP Specifications document and CORBA Services Specifications documents are widely distributed among those in the art and provide greater detail.

Returning to FIG. 5, the APC system 500 is adapted to control a semiconductor manufacturing environment. The software components communicate with each other using the CORBA IDL. The cooperating software components manage process control plans/strategies; collect data from process equipment, metrology tools, and add-on sensors; invoke various process control applications/algorithms with this information; and update process models and modify/download tool operating recipe parameters as appropriate. In the particular embodiment illustrated, the APC system 500 is a factory-wide software system, but this is not necessary to the practice of the invention. The strategies taught by the present invention can be applied to virtually any computer system, on any scale.

In an exemplary implementation, the APC system 500 includes an APC host computer 505, a database server 510, a processing tool 520, and one or more workstations 530. The processing tool 520 has been retrofitted with a processing sensor, or "add-on sensor," 525 that monitors the operation of the processing tool 520. The components of the APC system 500 are interconnected through a bus 535. The bus 535 may actually include multiple layers and use multiple protocols. Overall operation of the APC system 500 is directed by an APC system manager 540 resident on an APC host computer 505. The APC system manager 540 provides:

administrative, configuration, event, and state services for all servers developed for the APC Framework;

definition, grouping, installation, and management of the components in the APC system 500;

centralized services for capturing activity and trace information for diagnostic and monitoring purposes;

a centralized repository of component configuration information, including setup values, system environment settings; and lists of dependent objects and event channels.

However, in alternative embodiments, these functions may be divided into one or more software components, e.g., a base manager, a system manager, a logger, and a registry.

The APC system 500 includes a network of software components functioning as processing modules. These software components are sometimes referred to as "integration components." The integration components in this particular embodiment include, but are not limited to, the APC system manager 540; a plan execution manager 545; the equipment interfaces 550, 555 associated with the tools 520, 525; an add-on sensor 558; a sensor interface 560 associated with the processing tool 520; an application interface 565; an operator interface 580; and a data handler 585. Integration components serve as interfaces to existing factory systems, and provide capabilities for running APC Plans. An "APC Plan" is an application program called to perform some specific task, as is discussed more fully below. The integration components are shown as they might be hosted by the various processing resources within the APC system 500. These specific hosting locations are provided for exemplary purposes. The processing resources are interconnected, and the various software components may be either distributed among the various computers or centralized, depending on the complexity of the system.

Each of the integration components in this particular embodiment, are software-implemented. They are programmed in C++ using object-oriented programming techniques as are known in the art. Note, however, that alternative embodiments may employ techniques that are not object oriented and programming languages other than C++. One advantage of the APC system 500 is its modular structure, which provides portability of software components.

The plan execution manager 545 is the component primarily responsible for "choreographing" the operation of the APC System 500. The plan execution manager 545 interprets APC plans, executes main scripts and subscripts, and invokes event scripts as events dictate. A variety of plans, scripts, and subscripts may be used in various implementations. The specific number and function of various plans, scripts, and subscripts will be implementation specific. For instance, the present embodiment includes, but is not limited to, the following plans:

a data collection plan—a data structure used by sensor and machine interfaces defining the requirements for what data should be collected from a specific processing equipment, and how that data should be reported back;

a duration plan—a plan that defines trigger conditions and trigger delays that cause sensors to act, e.g., start data collection, stop data collection;

a reporting plan—a plan that defines what to do with the collected data, as well as when to signal the data's availability;

a sampling plan—a plan that defines the frequency at which the data is to be collected by an external sensor;

a control plan—a collection of control scripts designed to be used together to perform APC activities; and a control script—a sequence of actions/activities that the APC system is to execute under a particular defined situation.

The plan execution manager 545 coordinates the execution of user-defined process control plans among all the integration components for a given processing tool, such as the tool 520. When instructed, the plan execution manager 545 retrieves a plan and its associated scripts. It preprocesses subscripts to provide routines to main and event scripts. It also obtains a list of the capabilities necessary to execute the plan, as specified in the plan and connects to the proper integration components providing the required capabilities.

The plan execution manager 545 then delegates responsibility to run the plan to a plan executor 590. In the illustrated embodiment, plan executors 590 are created by the plan execution manager 545 to sequentially execute the plan and report completion of the plan, or errors in the execution of the plan, to the plan execution manager 545. Thus, while the plan execution manager 545 is responsible for the overall management of all plans executed, each plan executor 590 is responsible for running only one plan. The plan executor 590 is created by the plan execution manager 545, exists for the life of the plan, and is destroyed by the plan execution manager 545 after reporting that the plan is completed or aborted. Each plan executor 590 executes a main script and zero or more event scripts. The plan execution manager 545 can start multiple plans concurrently via multiple plan executors.

The machine interface 570 bridges the gap between the APC framework, e.g., the APC system manager 540, and the equipment interface 550. The machine interface 570 interfaces the processing tool 520 with the APC framework and support machine setup, activation, monitoring, and data collection. In this particular embodiment, the machine interface 570 primarily translates between specific communications of the equipment interface 550 and CORBA communications of the APC framework. More particularly, the machine interface 570 receives commands, status events, and collected data from the equipment interface 550 and forwards as needed to other APC components and event channels. In turn, responses from other APC components are received by the machine interface 570 and routed to the equipment interface 550. The machine interface 570 also reformats and restructures messages and data as necessary. The machine interface 570 supports the startup/shutdown procedures within the APC System Manager 540. They also serve as APC data collectors, buffering data collected by the equipment interface 550 and emitting appropriate data collection events.

The sensor interface 560 collects data generated by the add-on sensor 525. The sensor interface 560 provides the appropriate interface environment for the APC framework to communicate with external sensors, such as LabVIEW® or other sensor, bus-based data acquisition software. The application interface 565 provides the appropriate interface environment to execute control plug-in applications such as LabVIEW, Mathematical, ModelWare, MatLab, Simca 4000, and Excel. Although the processing sensor 525 is an add-on sensor, the sensors in alternative embodiments may be supplied with the processing tool 520 by the original equipment manufacturer ("OEM"). The sensor interface 560 collects data generated by the sensor 525. The application interface 565 takes data from the plan executor 590 and performs calculations or analysis on that data. The results are then returned to the plan executor 590. The machine interface 570 and the sensor interface 560 use a common set of functionality to collect data to be used. The equipment interface 550 gathers the respective data collected by the sensors on the processing tool 520 and transmits the gathered data to the machine interface 570.

The operator interface 580 facilitates communication between a wafer fabrication technician and the APC system 500 via a graphical user interface ("GUI") (not shown). The GUI may be a Windows® or UNIX-based operating system. However, this is not necessary to the practice of the invention. Indeed, some alternative embodiments might not even employ a GUI and may communicate through a disk operating system ("DOS") based operating system. The operator interface 580 displays dialogue boxes to provide information, request guidance and collect additional data. Through a CORBA interface, the operator interface 580 allows technicians to display a variety of pop-up dialogs simultaneously on any number of display groups. The operator interface 580 also maintains a group of displays in which a pop-up could appear. The operator interface 580 may also provide an announcement operation, i.e., a one-way message that displays a simple pop-up with message and "OK" button.

The data handler 585 receives data generated by other APC system 500 components and stores the data in the data store 595 (e.g., a relational database) on the database server 510. The data handler 585 may be adapted to receive standard structured query language ("SQL") commands, or alternatively, the data handler 585 may translate a different type of access protocol to generate a SQL command or some other protocol command. Centralizing the data storage functions increases the portability of the various components.

In the particular embodiment illustrated, the processing tool 520 is a CMP tool such as the tool 105 in FIG. 1. The processing sensor 525 measures the downforce exerted by each of the five carrier arms (not shown) of the processing tool 520. Again, alternative embodiments might employ alternative types of processing tools and/or sensors. For instance, the processing tool 520 might be a multi-chamber etcher, and the processing sensors 525 might sense temperature or pressure in the chambers in alternative embodiments.

The operation begins when the APC system manager 540 delegates the requisite plans to the plan execution manager. The plans delegated in this particular embodiment include a duration plan, a reporting plan, a sampling plan, and a control plan. The plan execution manager 545 then creates a plan executor 590 for each plan. The plan executors then begin executing their respective main scripts and any subsidiary scripts.

The CMP operation commences in accordance with the control plan and associated scripts at the beginning of a "run" of wafers. The processing sensor 525 begins collecting data in accordance with the duration and sampling plans. The processing sensors 525 forward the data pursuant to the reporting plan to the data handler 585 through the sensor interface 560. The data handler then stores the reported data to the data structure 595 through the data server 510 in accordance with the reporting plan. This continues until the end of the run as defined by the various plans, whereupon the plan executors 590 are destroyed.

After the run is over, the APC system manager 540 invokes a software application 575 residing on the APC host computer 505. The software application 575 analyzes the data in the data store 595 to see whether the operations in each processing station reached the endpoint at the same time, i.e., were matched. If not, the software application 575 will analyze the data to see why not. For instance, in a CMP operation, one carrier might consistently underpolish a wafer because of insufficient downforce. Manifestly, this aspect of the invention will be implementation specific, depending on the operation performed by the processing tool 520.

Once the software application concludes the analysis, the results are transmitted back to the APC System Manager 540. These results include changes to the recipe that will "match" the process endpoints on the various stations. One consequence of this art is that the recipe will be individualized, or tailored, for each processing station. These changes are incorporated in the next run of wafers when the control plan for the next run is issued. The new control plan is issued, and it will implement the tailored recipes for each processing station.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for processing a wafer in a semiconductor manufacturing process, comprising:

collecting a set of processing rate data from a multi-station processing tool, the set including process rate data from at least two stations in the processing tool;

communicating the collected processing rate data to a controller;

autonomously comparing the processing rate data to determine whether to adjust a process parameter; and adjusting the process parameter for at least one station to match the process endpoint for the at least one station.

2. The method of claim 1, wherein collecting the set of process data from the multi-station processing tool includes collecting the set of processing data from one of a chemical-mechanical polishing tool and a multi-chamber etcher.

3. The method of claim 1, wherein collecting the set of processing rate data includes collecting data regarding the elapsed time to a process endpoint.

4. The method of claim 2, wherein the chemical-polishing tool is selected and adjusting the at least one process parameter includes adjusting one of a downforce, a table motor current, and a carrier motor current.

5. The method of claim 1, wherein collecting the set of processing rate data includes:

sampling data generated during the process for a pre-defined period of time;

storing the sampled data; and reporting the stored data at the end of the predefined period of time to a controller.

6. The method of claim 5, wherein reporting the stored data to the controller includes reporting the data to a controller capable of adjusting the at least one parameter.

7. The method of claim 1, wherein the semiconductor manufacturing process comprises a portion of an advanced process control system.

8. The method of claim 7, wherein collecting the set of processing rate data includes issuing at least one of a data collection plan, a duration plan, a reporting plan, and a sampling plan.

9. The method of claim 7, wherein adjusting the at least one processing parameter includes:

destroying a first control plan; and issuing a second control plan including a control script containing the adjustment to the process parameter.

10. The method of claim 1, wherein:

collecting the set of processing rate data includes collecting the set of processing data in a first run; and adjusting the at least one process parameter includes adjusting the at least one parameter in a second run.

11. A program storage medium encoded with instructions that, when executed by a computing device, perform a method for processing a wafer in a semiconductor manufacturing process, comprising:

collecting a set of processing rate data from a multi-station processing tool, the set including process rate data from at least two stations in the processing tool;

communicating the collected processing rate data to a controller;

autonomously comparing the processing rate data to determine whether to adjust a process parameter; and adjusting the process parameter for at least one station to match the process endpoint for the at least one station.

12. The program storage medium of claim 11, wherein collecting the set of process data from the multi-station processing tool in the encoded method includes collecting the set of processing data from one of chemical-mechanical polishing tool and a multi-chamber etcher.

13. The program storage medium of claim 11, wherein collecting the set of processing rate data in the encoded method includes collecting data regarding the elapsed time to a process endpoint.

14. The program storage medium of claim 12, wherein the chemical-polishing tool is selected and adjusting the at least one process parameter in the encoded method includes adjusting one of a downforce, a table motor current, and a carrier motor current.

15. The program storage medium of claim 11, wherein collecting the set of processing rate data in the encoded method includes:

sampling data generated during the process for a pre-defined period of time;

storing the sampled data; and reporting the stored data at the end of the predefined period of time to a controller.

16. The program storage medium of claim 15, wherein reporting the stored data to the controller in the encoded method includes reporting the data to a controller capable of adjusting the at least one parameter.

17. The program storage medium of claim 11, wherein the semiconductor manufacturing process comprises a portion of an advanced process control system.

18. The program storage medium of claim 17, wherein collecting the set of processing rate data in the encoded method includes issuing at least one of a data collection plan, a duration plan, a reporting plan, and a sampling plan.

19. The program storage medium of claim 17, wherein adjusting the at least one processing parameter in the encoded method includes:

destroying a first control plan; and issuing a second control plan including a control script containing the adjustment to the process parameter.

20. The program storage medium of claim 11, wherein:

collecting the set of processing rate data in the encoded method includes collecting the set of processing data in a first run; and adjusting the at least one process parameter in the encoded method includes adjusting the at least one parameter in a second run.

21. The computer-readable, program storage medium of claim 11, wherein the computer-readable, program storage medium comprises one of a magnetic medium and an optical medium.

22. The computer-readable, program storage medium of claim 11, wherein the computer-readable, program storage medium comprises the magnetic medium and is one of a floppy disk and a hard disk.

23. The computer-readable, program storage medium of claim 11, wherein the computer-readable, program storage medium comprises the optical medium and is one of a CD ROM, a CD WORM, and a DVD.

24. A computing device programmed to perform a method for processing a wafer in a semiconductor manufacturing process, comprising:

collecting a set of processing rate data from a multi-station processing tool, the set including process rate data from at least two stations in the processing tool;

communicating the collected processing rate data to a controller;

autonomously comparing the processing rate data to determine whether to adjust a process parameter; and adjusting the process parameter for at least one station to match the process endpoint for the at least one station.

25. The programmed computing device of claim 24, wherein collecting the set of process data from the multi-station processing tool in the programmed method includes collecting the set of processing data from one of a chemical-mechanical polishing tool and a multi-chamber etcher.

26. The programmed computing device of claim 24, wherein collecting the set of processing rate data in the programmed method includes collecting data regarding the elapsed time to a process endpoint.

27. The programmed computing device of claim 25, wherein the chemical-polishing tool is selected and adjusting the at least one process parameter in the programmed method includes adjusting one of a downforce, a table motor current, and a carrier motor current.

28. The programmed computing device of claim 24, wherein collecting the set of processing rate data in the programmed method includes:

sampling data generated during the process for a predefined period of time;

storing the sampled data; and reporting the stored data at the end of the predefined period of time to a controller.

29. The programmed computing device of claim 28, wherein reporting the stored data to the controller in the programmed method includes reporting the data to a controller capable of adjusting the at least one parameter.

30. The programmed computing device of claim 24, wherein the semiconductor manufacturing process comprises a portion of an advanced process control system.

31. The programmed computing device of claim 30, wherein collecting the set of processing rate data in the programmed method includes issuing at least one of a data collection plan, a duration plan, a reporting plan, and a sampling plan.

32. The programmed computing device of claim 30, wherein adjusting the at least one processing parameter in the programmed method includes:

destroying a first control plan; and issuing a second control plan including a control script containing the adjustment to the process parameter.

33. The programmed computing device of claim 24, wherein:

collecting the set of processing rate data in the programmed method includes collecting the set of processing data in a first run; and adjusting the at least one process parameter in the programmed method includes adjusting the at least one parameter in a second run.

34. The programmed computing device of claim 24, wherein the programmed computing device is one of:

a stand-alone computer; and an embedded processor.

35. The programmed computing device of claim 24, wherein the programmed computing device comprises the stand-alone computer and the stand-along computer is selected from the group comprising a workstation, a desktop personal computer, a notebook computer, a laptop computer, and a palmtop computer.

36. The programmed computing device of claim 24, wherein the programmed computing device is further programmed with an operating system selected from the group comprising Windows®, MS-DOS, OS/2, UNIX, or Mac OS.

37. The programmed computing device of claim 24, wherein the programmed computing device comprises the stand-alone computer and controls the polishing tool over one of a bus system and a network operating in accordance with a standard selected from the group comprising Ethernet, RAMBUS, Firewire, token ring, straight bus, RS232, SECS, and GEM.

38. The programmed computing device of claim 24, wherein the programmed computing device comprises the embedded processor and is selected from the group comprising a microprocessor, a digital signal processor, and a microcontroller.

* * * * *